United States Patent [19]
Kosinski et al.

[11] 3,952,256
[45] Apr. 20, 1976

[54] MULTI-IMPEDANCE OUTPUT FOR TRANSISTOR POWER AMPLIFIER

[75] Inventors: Frank J. Kosinski, Hauppauge; Anthony Ernest Franquciro, Holtsville, both of N.Y.

[73] Assignee: Unicord Incorporated, New York, N.Y.

[22] Filed: July 25, 1974

[21] Appl. No.: 491,831

[52] U.S. Cl. .................................. 330/15; 330/18; 330/195
[51] Int. Cl.² ............................................ H03F 3/26
[58] Field of Search ......................... 330/15, 195, 18

[56] References Cited
UNITED STATES PATENTS 2,932,800    4/1960    Bereskin ........................... 330/15 X
3,478,274    11/1969   Laurent et al. ................... 330/195 X Primary Examiner—James B. Mullins
Assistant Examiner—Lawrence J. Dahl
Attorney, Agent, or Firm—Colton & Stone, Inc.

[57] ABSTRACT

An audio amplifier with a transistorized power output stage furnishes an amplified audio signal to an autotransformer. The autotransformer has a plurality of taps to permit the selection of any of a plurality of output impedance levels. The autotransformer is wound on a bobbin in a novel manner so as to minimize distortion of the audio signal.

2 Claims, 1 Drawing Figure

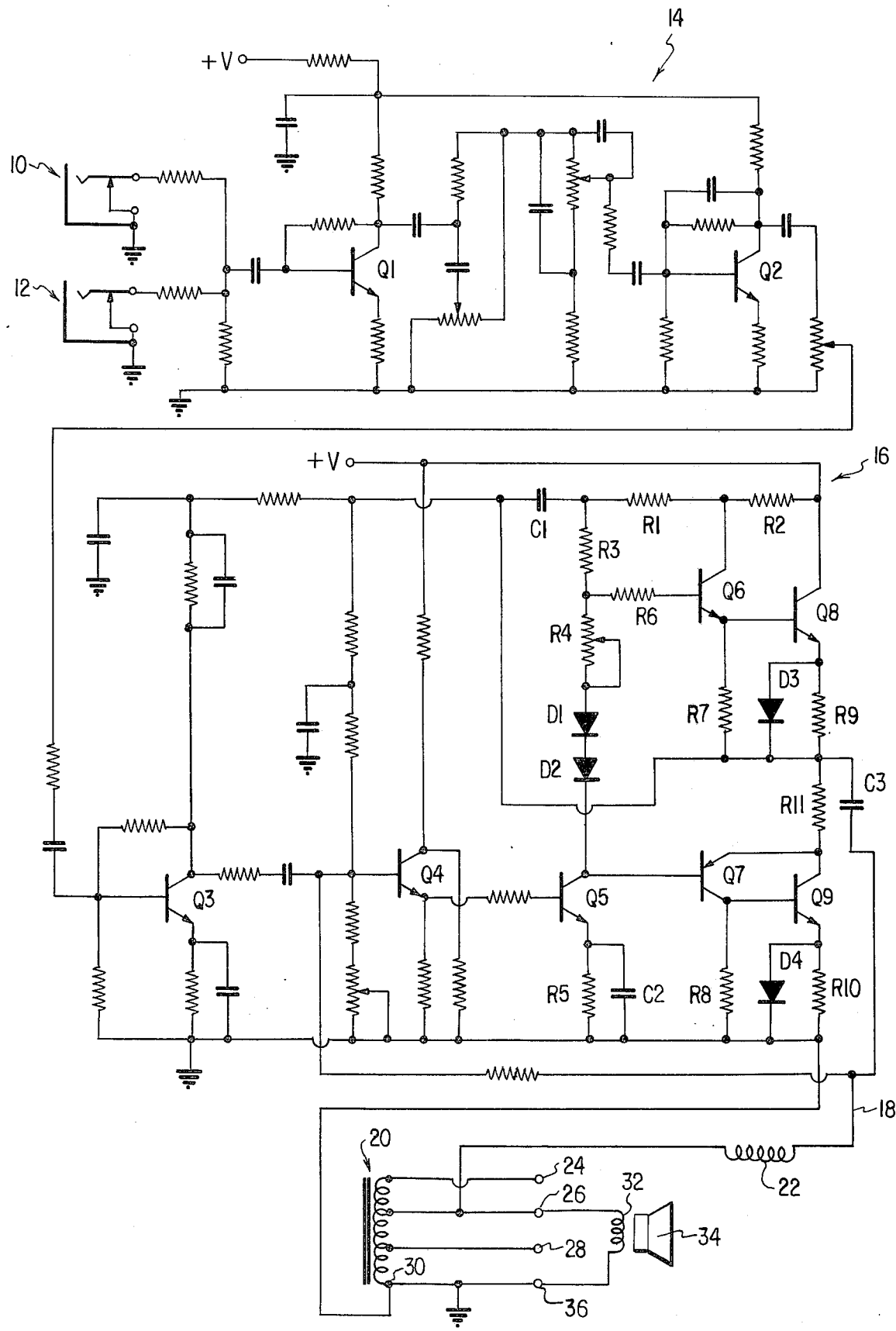

MULTI-IMPEDANCE OUTPUT FOR TRANSISTOR POWER AMPLIFIER

BACKGROUND OF THE INVENTION

The present invention is directed to an audio amplifier and, more particularly, to an audio amplifier employing an autotransformer to effect impedance matching between the amplifier power transistor output and a load, such as a loud speaker system.

Audio amplifiers are commonly designed to accommodate any of several different loads having different impedances. Typically, an audio amplifier will be provided with output terminals for driving speaker systems having 2, 4 or 8 ohm impedances. In order to provide impedance matching between the amplifier circuit and the loud speaker system, conventional audio amplifier circuits employ output transformers which have a primary winding driven by the power output stage of the amplifier and an electrically separate secondary winding having a plurality of taps to provide plural outputs at different impedance levels. Such conventional output transformers are capable of providing high fidelity output signals with a minimum of distortion throughout the audio range. However, these transformers are, of necessity, massive, typically being among the largest and heaviest components of an amplifier system.

Theoretically, the substitution of an autotransformer for a conventional primary-secondary output transformer would result in a reduction of the size, weight and expense of an audio amplifier system. With the exception of certain specialized applications, however, such arrangements have not been employed. This is due at least in part to the difficulty of obtaining an audio output signal from an autotransformer which is free of distortion throughout the audio range. Laurent et al., U.S. Pat. No. 3,478,274 and Slaats et al., Canadian Pat. No. 660,131 each disclose an amplifier circuit having an autotransformer for coupling the amplifier output signal to a speaker. Each of these circuits is intended for relatively low power operation, the amplifiers being designed for use in automobile radios. Each of these circuits require a nonconventional power output stage, this stage including a pair of transistors connected in push-pull relation and asymmetrically driven. Each of these circuits also require that the direct current power supply for the power transistors be connected through the autotransformer windings, one terminal of the direct current supply being connected to a center tap of the winding so that the supply current path for one of the power output transistors is through a first portion of the autotransformer winding and that of the other power output transistor is through at least part of the remainder of the winding. The imposition of the supply current on the winding of the autotransformer requires that the autotransformer be of greater load handling capacity than would be necessary if only the audio output signal of the amplifier was carried by the autotransformer winding. Typically, an arrangement such as that of the Laurent et al. or Slaats et al. patent requires the use of an auto transformer having a 30 percent greater power handling capacity than would be necessary if only the alternating current audio signal was handled by the autotransformer winding.

A primary object of the present invention is the provision of an audio amplifier circuit employing an autotransformer to effect impedance matching between the amplifier circuit and a load, such as a speaker system.

A further object of the present invention is the provision of an audio amplifier circuit in which the output transformer is an autotransformer, the amplifier circuit being of conventional design in all other aspects.

Another object of the present invention is the provision of an audio amplifier circuit having an autotransformer as the output transformer thereof and in which only the alternating current audio output signal is supplied to the autotransformer winding.

Yet another object of the present invention is the provision of an audio amplifier circuit having an autotransformer as the output transformer thereof and in which the autotransformer provides a plurality of outputs to accommodate different loads operating at different impedance levels.

It is also an object of the present invention to provide a novel autotransformer adapted to function as an audio amplifier output transformer and which is capable of effecting impedance matching between the amplifier and a load such as a loud speaker system with minimum distortion and degradation of the audio signals throughout the frequency of such signals.

BRIEF DESCRIPTION OF THE INVENTION

The above and other objects of the invention which will become apparent in the following description of the preferred embodiment of the invention are achieved by the provision of a novel autotransformer consisting of a plurality of coils wound in succession on a bobbin, the coils being wound without intercoil insulation and having their adjacent starting and ending portions interconnected to provide output taps for the autotransformer. The starting lead of the first wound coil and the terminating lead of the last wound coil also provide output terminals.

The invention also encompasses the combination of the novel autotransformer and an audio amplifier circuit having a transistorized power output stage producing an audio signal, the audio signal being supplied to one of the intermediate taps of the autotransformer and the tap corresponding to the terminating lead of the last wound coil being connected to ground. The load, typically a loud speaker system, is connected between ground and one of the taps of the autotransformer selected to provide proper impedance matching.

For a more complete understanding of the invention and the objects and advantages thereof, reference should be had to the following specification and the accompanying drawing wherein a preferred embodiment of the present invention is illustrated and described.

BRIEF DESCRIPTION OF THE DRAWING

The sole FIGURE of the drawing is a schematic showing of an audio amplifier circuit including an autotransformer providing a multi-impedance output.

DESCRIPTION OF THE PREFERRED EMBODIMENT

The amplifier circuit illustrated in the drawing is, with the exception of the output transformer, which is an autotransformer, a conventional audio amplifier. The particular amplifier shown is a Model U-4100 Solid State Bass Amplifier manufactured by Unicord Incorporated, the assignee of the present application. This amplifier is designed to amplify the signal generated by a bass guitar. It should be understood, however, that the present invention is not limited to the particular circuit illustrated or to musical instrument amplifiers but rather is applicable to all types of audio amplifiers. As the amplifier circuit illustrated is of known design, its operation will not be described in detail except as is necessary to describe the relation of the amplifier to the autotransformer.

The amplifier circuit includes a preamplifier section 14 having input terminals 10 and 12 for receiving audio signals to be amplified and amplifying transistors Q1 and Q2. The audio output signal of the preamplifier section 14 is supplied to the base of a transistor Q3 of amplifier section 16. The audio signal is passed from transistor Q3 to transistor Q4 and, subsequently, to the base of transistor Q5. Transistor Q5 serves as a driver for the power output stage of the amplifier section 16. The power output stage includes two transistor pairs, transistors Q6 and Q8 and transistor Q7 and Q9. The arrangement constitutes a conventional push-pull amplifier stage in which output transistors Q8 and Q9 are active during alternate half cycles of the audio signal to generate an alternating signal across capacitor C3 on conductor 18 which is the audio output signal of the amplifier section 16. It should be noted that the direct current supply potentials for the output transistors Q8 and Q9 are not present on the conductor 18.

The amplifier audio output signal on the conductor 18 is supplied to an autotransformer 20 across a fixed impedance 22. The autotransformer 20 has a plurality of taps 24–30 with the audio signal being supplied to an intermediate tap 26 and the end tap 30 being connected to ground. The autotransformer 20 serves to provide impedance matching between the amplifier section 16 and a load such as the coil 32 of a loud speaker 34. The taps 24, 26 and 28 of the autotransformer 20 provide different impedance level outputs and one terminal of the load coil 32 is connected to the one of these autotransformer output taps having the corresponding impedance level. The other lead of the load coil 32 is connected to a grounded terminal 36.

The autotransformer 20 is designed for minimal inductance and sequentially wound to provide maximum interwinding coupling while minimizing interwinding capacitance. The design prevents high frequency attenuation with resultant audio signal degradation and minimizes inductive coupling to prevent damage to the power output transistors Q8 and Q9. In the preferred embodiment, the autotransformer was wound on a bobbin, for example, a bobbin No. 5785 available from Amerline Corporation, 1800 West Fullerton Avenue, Chicago, Ill., or bobbin No. 1252 available from Cosmo Plastics Company, 3239 West 14th Street, Cleveland, Ohio 44109. Three windings were formed on the bobbin; the first winding comprising 70 turns of 19 AWG enamelled transformer wire; the second, 48 turns of 16 AWG enamelled transformer wire; and the third, 112 turns of 20 AWG enamelled transformer wire. All windings were scramble wound and no interwinding insulation was employed, either between the initial winding and the bobbin core or between successive windings. The starting lead of the first winding was brought out of the coil to form the terminal 24. The terminating lead of the first winding and the starting lead of the second winding were interconnected and form terminal 26, while the terminating lead of the second winding and the starting lead of the third winding together form terminal 28. The terminating lead of the final winding is connected to terminal 30.

By accomplishing the winding of the transformer without the use of any interwinding insulation between adjacent coils or between the first wound coil and the bobbin core, interwinding capacitance is held to a minimum.

What is claimed is:

1. An audio amplifier circuit, comprising:
   a source of operating potential;
   amplifying circuit means for receiving an audio input signal and generating drive signals corresponding thereto;
   a power output stage including a pair of transistors operated in push-pull relation, circuit means connecting said transistors to said source of operating potential, the emitter of one of said transistors being connected across a first resistor to a junction point, the collector of the other of said transistors being connected across a second resistor to said junction point, said transistors receiving said drive signals and generating an audio output signal at said junction point in response thereto;
   an autotransformer having a plurality of taps; and
   conductor means connecting said junction point to one of said taps of said autotransformer so as to pass said output signal conductively through the portion of the winding of said autotransformer between two of said taps, the taps of said autotransformer providing output terminals for said audio amplifier circuit for connecting said audio amplifier circuit to loads having different impedance levels.

2. The audio amplifier circuit of claim 1 wherein said conductor means includes a capacitor and fixed impedance means in series relation between said junction point and said one of said taps.

* * * * *